United States Patent [19]
Missale

[11] 3,934,202
[45] Jan. 20, 1976

[54] TOUR GUIDE SYSTEM INCLUDING MEANS FOR NOISE AND CROSSTALK SUPPRESSION

[75] Inventor: John V. Missale, New York City, N.Y.

[73] Assignee: Telesonic Systems, Inc., Fairfield, N.J.

[22] Filed: Mar. 25, 1974

[21] Appl. No.: 454,519

[52] U.S. Cl. .................... 325/54; 325/62; 179/82; 333/14; 343/200
[51] Int. Cl.² .......................................... H04B 5/00
[58] Field of Search 179/1 UL, 1 VC, 82, 100.2 MD; 325/51, 53, 54, 62, 308; 333/14; 343/200; 179/15 AV; 330/30 R, 29, 124 R

[56] References Cited
UNITED STATES PATENTS

| | | | |
|---|---|---|---|
| 2,193,966 | 3/1940 | Jones | 333/14 |
| 2,567,431 | 9/1951 | Halstead | 179/82 |
| 2,883,523 | 4/1959 | Meserow | 325/53 X |
| 3,078,348 | 2/1963 | McIntosh | 179/82 |
| 3,474,451 | 10/1969 | Abel | 179/82 X |
| 3,601,550 | 8/1971 | Spracklen | 179/82 |
| 3,769,612 | 10/1973 | Yamazaki | 333/14 |
| 3,798,562 | 3/1974 | Takahashi et al. | 333/14 X |

Primary Examiner—Benedict V. Safourek
Attorney, Agent, or Firm—Behr & Woodbridge

[57] ABSTRACT

An electronic tour guide system including means for suppressing objectionable crosstalk and noise is described. Crosstalk suppression is achieved by means of a comprssor in the transmitter and an expander in the receiver. Objectionable noise between loops is eliminated by means of a squelch circuit which reduces power drain whenever the received signal is below a certain threshold. The transmitter and receiver are designed to handle a plurality of information signals simultaneously. For example, a listener can select one of several different languages broadcast within an antenna loop. The transmitting loop antenna is matched in impedance to the output of the channel means in the transmitter so that maximum power transfer is obtained. Each receiver is further equipped with a gravity operated mercury switch which turns off power to the receiver when the receiver chasis is inverted. It is anticipated that this system will find application in museums, art galleries, archeological sites and the like where it is desirable to guide people from location to location and to address them in their respective languages.

10 Claims, 4 Drawing Figures

TOUR GUIDE SYSTEM INCLUDING MEANS FOR NOISE AND CROSSTALK SUPPRESSION

BACKGROUND OF THE INVENTION

1. Field of the Invention

This invention relates to a radio tour guiding system in general and, in particular, to a tour guiding system having superior crosstalk and noise suppression capabilities.

2. Description of the Prior Art

There are presently several systems available on the market for guiding visitors through museums and the like by means of a radio transmitter/receiver system. One such system is sold by Serac, and is installed in the Metropolitan Museum of Art in New York.

Several prior art tour guides systems are also disclosed in the patent literature. Arber, U.S. Pat. No. 3,118,144; McIntosh, U.S. Pat. No. 3,078,348; Margolin, U.S. Pat. No. 2,942,066; and Abel, U.S. Pat. No. 3,474,451, all disclose lecture broadcasting systems of the sort well known to those of ordinary skill in the art. Arber was one of the first low power, multi-frequency communication systems developed that was suitable for museum lectures and the like. It suffers from the major deficiency that it uses antennas that are not directly closed loop, i.e. they depend upon a common ground for the return connection. It has been found that such systems suffer from re-radiation within steel buildings and the like and therefore often respond poorly to noise and crosstalk. McIntosh is of importance in that it teaches the use of a tuned closed loop broadcasting antenna coupled to a transmitter by means of an isolation transformer. Abel teaches a similar technique but is restricted to an FM communications system.

Additionally, different types of antenna configurations have been experimented with in order to produce improved propagation characteristics. The following patents to Mr. Justin L. Turner are typical of the foregoing developments: U.S. Pat. Nos. 3,549,818; 3,598,923; and 3,673,334.

One major problem that has been experienced by prior art systems is the interference with the information signal by crosstalk and noise originating from other loops. One solution to this problem is to produce an FM communications system such as disclosed by Abel. However, the Abel approach is relatively complex and sophisticated and requires that no difference side bands be produced in the receiver by the beating together of adjacent or alternate channels, or the difference side bands of adjacent or alternate channels.

In this fashion, no difference side bands are generated which have amplitude levels sufficient to produce interference in the audio information band and thereby distract the listener. Therefore, a solution was sought which could employ the relatively simple AM circuitry as known in the prior art and achieve sufficient crosstalk and noise suppression so that adjacent loops do not significantly interfere with one another. As a partial solution to this problem a novel compressor/expander system was developed to suppress the undesirable crosstalk within the loops. In general, compression/expansion techniques have found use in some other communications areas. The following prior art patents are typical of the use of the compressor/expander technique: Levine, U.S. Pat. No. 2,795,650; Lehan, U.S. Pat. No. 3,158,864; Miller, U.S. Pat. No. 3,471,648; Takahashi, et al., U.S. Pat. No. 3,757,354. Additionally, this technique has also been used to reduce tape and disc audio noise as described in the following U.S. Pat. Nos.: Ray Milton Dolby: 3,631,365 and 3,665,345. A good treatment of the Dolby B system can be found in December, 1973 issue of the IEEE Spectrum, pages 31 and 32. While expansion/compression techniques have found some limited utility in other areas of radio communications, this appears to be a first time that such a technique has been successfully used to reduce the noise associated with a closed loop, low power, multi-channel lecture broadcast system. The technique appears to be so successful that it is possible to place adjacent loops as close as 18 inches from one another without a significant amount of crosstalk. Prior to the use of the compression/expansion technique in the lecture broadcast system, it was not possible to eliminate crosstalk without separating the loops by a considerable distance. Additionally, the compression/expansion system developed to solve this problem appears to have special features not found in prior art compression/expansion systems.

To further reduce noise and drain on the receiver power source, a novel squelch means has been included in the Applicant's receiver. The squelch means reduces the power consumption of the receiver whenever an incoming signal is below a certain threshold value. The receiver may also be equipped with a gravity operated, mercury switch which will completely disconnect the power source of the receiver from the rest of the circuit whenever the receiver chasis is inverted.

SUMMARY OF THE INVENTION

According to a preferred embodiment the lecture broadcast system includes a transmitter and at least one receiver. The transmitter includes a multi-channel tape-recorder in which information in a variety of languages is recorded on the recorder, one language per channel. Each taped channel is then fed into a transmitter channel means which includes an audio preamplifier, a compressor, an AM modulator in which the output of a free running oscillator is modulated by the signal from the compressor, a line driver, an impedance matching means, an isolation transformer, and a closed loop antenna. The receiver preferably comprises a receiving antenna consisting of a pair of crossed ferrite core antennas in order to increase omnidirectional signal capability, a frequency select means, an RF preamplifier, an AM detector, an expander circuit, a squelch means, an output driver and an acoustical transducer.

In operation, the signal from one channel of the tape deck is compressed by the compressor in such a fashion that the high and low amplitude portions of the signal fall within a relatively narrow dynamic range. The compressed signal then modulates a carrier frequency and is then radiated by means of the loop antenna. The radiated signal is then picked up by the receiver in the receiving antenna and detected for AM modulation before being passed to the expander. The expander has complementary, inverse characteristics to the compressor in the transmitter and therefore the output signal is a relatively true reproduction of the signal from the multi-channel tape deck. This signal is then amplified and passed thru a squelch means before it goes to the acoustical transducer. The squelch means turns off power to the squelch amplifier whenever the input signal is low. This saves on drain of the receiver power source, especially when the receiver's are not in the vicinity of one of the closed loops. It has been found that crosstalk is eliminated by means of the compressor/expander technique because the crosstalk signals which are generated in the loop antennas are of a lower value than the compressed signal and when expanded the lower level signals are amplified with less gain than the higher level compressed signals. In this fashion the crosstalk is effectively suppressed and the information from the tape deck is acurately reproduced. The system also includes a novel gravity operated switch which turns on power to the receiver whenever the receiver is inverted.

These and other features of the invention will be more fully appreciated in light of the following drawings.

DETAILED DESCRIPTION OF THE INVENTION

During the course of this description, it will be appreciated that like reference numbers may refer to like elements as shown in the different drawings.

Figure 1:
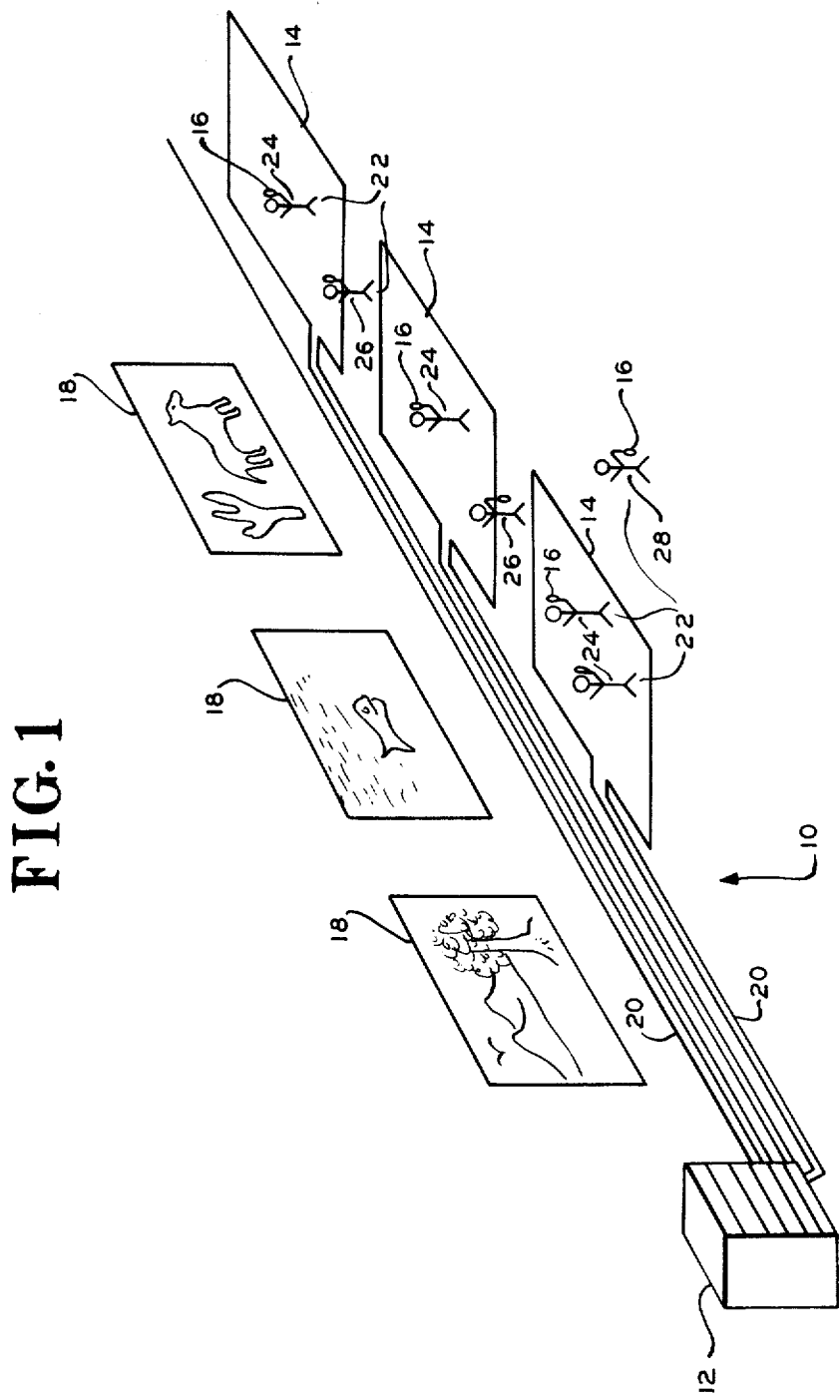
FIG. 1 is a general illustration of how a system of the present may be employed in a typical museum or art gallery.

The system of the present invention as shown according to a preferred embodiment can be found in FIG. 1. The system 10 is seen to include a master transmitter 12, a plurality of loop antennas 14 and a plurality of hand held receiving devices 16. According to this particular embodiment a antenna loop is placed roughly in front of a plurality of display cases 18. Each loop 14 is connected via transmission lines 20 to a plurality of individual transmitters located within master transmitter housing 12. A detailed description of the transmitter will be discussed infra with regard to FIG. 3. In the embodiment of the FIG. 1, which shows the system 10 in the context of a plurality of museum displays, a group of guests 22 or visitors are shown during various stages of the lecture tour. For purposes of this discussion the guest within the loop will be referred to as 24, the between-loop guest will be referred to as 26 and the out-of-loop range guest will be referred to as guest 28.

In operation the preferred tour guide system will provide information to the guests 24 as they stand in front of the corresponding display 18. The information is typically given in a plurality of languages which may be individually selected by a means to be described later on the receiver 16. Typically a guest 22 will walk within the loop, dial a language in which he wishes to hear the lecture, and after the lecture is over he will be directed by the recorded message to proceed to the next loop 14 and its corresponding display 18. In this manner a guest is guided from loop to loop until the lecture is completed. As discussed previously, one of the major difficulties with loop systems is that there tends to be a great amount of crosstalk between adjacent loops 14. Also as a guest 26 walks between loops there is a tendency for the receiver to indiscriminately latch onto one of the other of the loops 14 or to both thereby causing an undesirable background noise. The system of this invention is an improvement over prior art museum tour guide systems in that the novel compressor/expander system greatly reduces the loop-to-loop crosstalk and a novel squelch means greatly reduces the problems encountered by the between-loop guest 26. Additionally, the receiver 16 is equipped with a gravity operated switch so that when the receiver 16 is inverted, such as when it is held by its strap, the power to the receiver is automatically cut off and thereby the drain on its battery is severely diminished.

While the system of FIG. 1 is shown in the context of a museum it will be clearly understood that such a system 10 is easily applicable to such environments as art galleries, archeological sites, caves, or any other location in which automatic tour guiding is desired. The choice of a museum context is only for the purposes of illustration.

Figure 2:
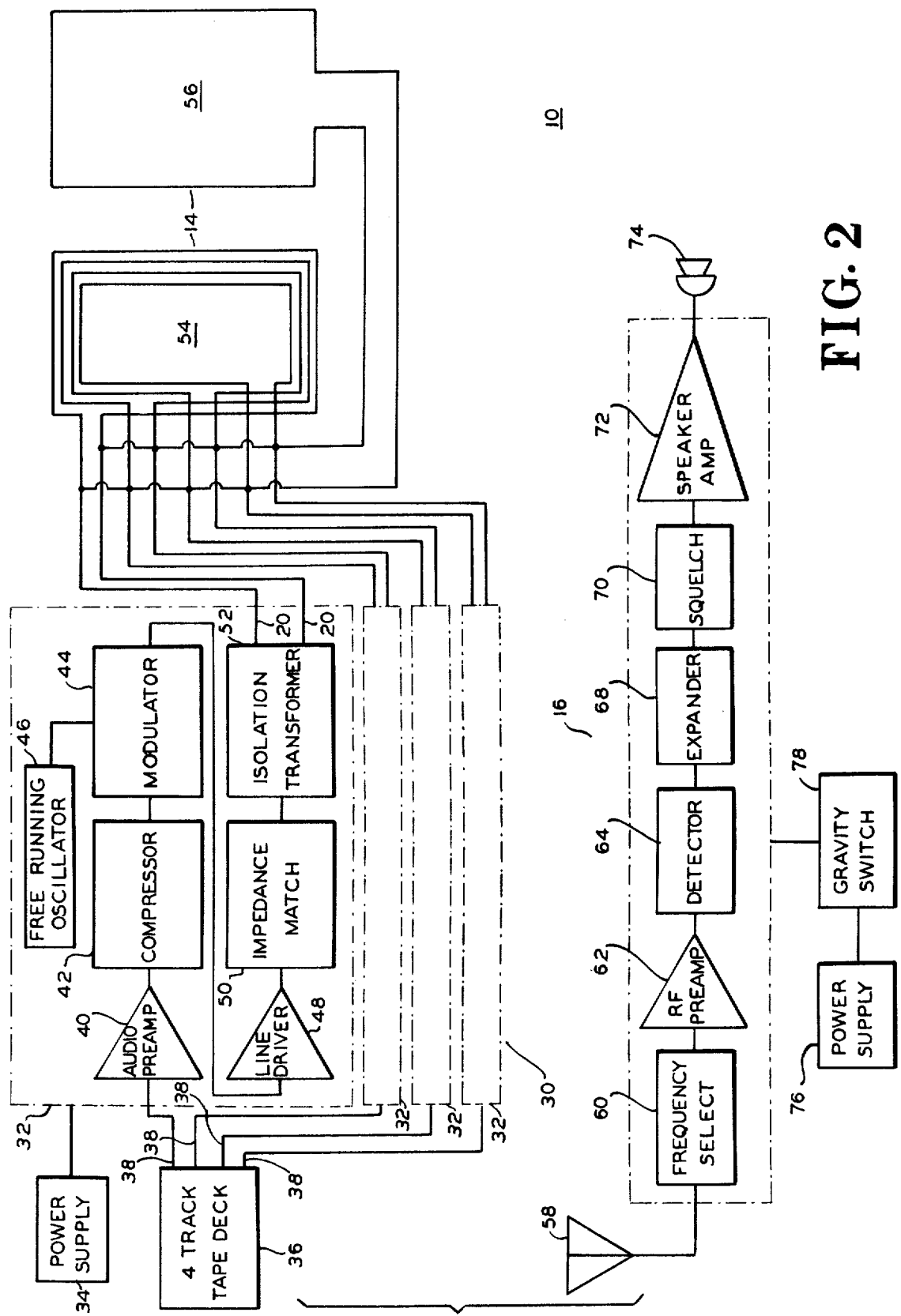
FIG. 2 is a schematic representation of the system of the present invention in which the basic elements are shown in block form.

A simplified schematic of the system 10 can be found in FIG. 2. According to a preferred embodiment the master transmitter housing 12 contains a plurality of individual transmitters 30. In turn, each of the transmitters 30 include individual subtransmitter channel means 32. Each of the channel means 32 is powered by a power supply 34 and receives its input signal information from a tape deck 36. According to a preferred embodiment the tape deck 36 may be a multi-channel or multi-track tape deck but in practice, it is only necessary that a device be employed which can simultaneously and in coordination supply the signal information to the channel means 32. Each of the channels of the tape deck might include a lecture on a particular display 18 but in a different language. For instance, a four-track tape deck 36 is shown in FIG. 2 and according to a typical embodiment one language may be English, one language may be French, one may be German, and one may be Spanish. Or, it may be desirable to record two or more channels in the same language but aimed at a difference audience. For instance, one channel may be aimed at adults while another channel may be aimed at children and a third channel may be aimed at some other special interest group.

Signal information from the four-track tape deck 36 is fed via signal lines 38 to the prospective subtransmitter channel means 32. Only one channel means 38 is shown in detail, but it will be understood that the other channel means are substantially the same. Likewise, while four channels are illustrated, it will be understood that almost any number of channels can be employed.

Each channel means includes an audio preamplifier 40, a compressor means 42, a modulator 44 which is fed by a free running oscillator 46, a line driver 48, and impedance matching means 50, and an isolation transformer device 52. The output of each channel means 32 is connected via transmission lines 20 to a closed loop antenna 14. According to FIG. 2 the closed loop transmitting antenna may prefreably be of one of two possible varieties. According to one embodiment each closed loop antenna is connected directly to a respective channel means so that the output antenna 14 is in actuality a collection of loop antennas, each tuned to a specific frequency. This multiple loop antenna 54 has the obvious disadvantage that it is more expensive to construct and maintain because it requires more wiring. However, the multiple loop system has the advantage of being able to accommodate museum exhibition layouts that change from time to time. For example, it is relatively easy to make a large zone out of several smaller zones if the size of a specific exhibit increases.

Alternatively, the secondaries of isolation transformers 52 may be connected in parallel across a single closed loop antenna 56. This embodiment of course has the advantage that it is more economical to install. It will be appreciated also that while the windings of the isolation transformers 52 are shown in parallel they could be connected in series under appropriate circumstances and connected across 56. Additionally, it is possible to connect a plurality of multiple loop antennas 54 and single closed loop antennas 56 together in the fashion shown. As a general principle, however, this may not be desirable since the more complex the antenna system, the more difficult it may be to tune.

A transmitter 16 according to the present invention includes an antenna 58 having relatively good omni-directional reception capabilities, a frequency selecting device for choosing which of the transmitter signals follow 60, a radio frequency preamplifier 62, an amplitude modulation detector 64, an expander 68, a squelch device 70, a speaker amplifier 72, and a speaker type transducer 74. The receiver is powered by a battery power supply 76. The power from the power supply 76 is controlled by a gravity switch 78 which shuts off power to the receiver whenever the receiver chasis is inverted.

In typical operation a signal from the four-track tape deck 36 is fed thru signal line 38 to the input of an audio preamplifier 40. The signal is then amplified and fed to compressor 42 wherein the low volume component of the signal is amplified with a greater gain than the high volume component of the input signal thereby compressing the dynamic range of the signal into the compressor. The signal from the compressor is then fed to modulator 44 where it modulates the carrier frequency supplied by free running oscillator 46. Free running oscillator 46 generally determines the frequency at which the transmitted signal will be broadcast. The output signal of the modulator 44 is amplified by line driver 48 and fed to isolation transformer 52 via impedence matching means 50. The output from the isolation transformer 52 is fed either to a multiple loop antenna 54 or to a single closed loop antenna 56, or to a combination of both. The input side of isolation transformer 52 is connected to a primary winding and the output side is connected to a secondary winding. The impedance matching means 52 preferably comprises a parallel resistor/compacitor combination which tunes the output impedance of the channel means 32 to the input impedance of either antennas 54 or 56. The amplitude range of the signal transmitted by antennas 14 is dynamically narrow and of a considerably higher volume than the crosstalk that normally occurs from adjacent loop antennas.

The transmitted signal from the transmitter is received by receiving antenna 58 and fed into a frequency select means 60. Frequency select means 60 is a tank type inductor/capacitor circuit in which a plurality of capacitors may be connected with a single inductor so that the resulting tank circuit resonates at the carrier frequency produced by free running oscillator 46. It will be appreciated that while only one free running oscillator 46 is shown, each channel means may have associated with it a means for selecting from any one of four oscillation sources. However, it is possible to provide each transmitter with a single master oscillator which feeds each channel. Therefore, the term "oscillator means" in the context of this invention is meant to comprehend the use of one oscillator per channel or the use of a single master oscillator with a plurality of channels simultaneously. With regard to the receiver system 16, the output from the frequency select means 60, in which a particular language or mode of instruction has been selected, passes to a common type radio frequency preamplifier 52 and then to a diode detector 64. The diode detector takes the smplitude modulated information from the incoming signal and passes that detected information on to expander 68. Expander 68 has complimentary, that is inverse, non-linear characteristics with respect to compressor 62. Expander 68 amplifies incoming signals of lower volume at a lesser gain than incoming signals of greater volume, thereby expanding the dynamic range of the signal and restoring the original signals to their previous undisturbed, linear characteristics. Since the crosstalk which adversely affects prior art tour guide systems, is of a much lower amplitude than the compressed signal received from the transmitter, the crosstalk signals are thereby amplified at a considerably lower gain than the compressed signals and therefore the output from the expander is virtually free of the crosstalk component. As discussed previously, the problem of crosstalk is greatest for the within-loop guests 24 because normally the guest or visitor will not be listening to the transmitter 16 unless he is in front of the display 18 and therefore within a loop antenna 14.

The signal from the expander 68 is fed to the input of a squelch circuit 70. The squelch circuit 70 has the ability to minimize power drain on the amplifier whenever the input signal to the squelch circuit is below a predetermined threshold. Therefore, if a weak informational signal is being received by the antenna, such as when a guest or visitor 22 is between loops, as with guests 26, the squelch circuit will act to reduce the drain on the speaker amplifier 72. As suggested the output of squelch circuit 70 is connected to the input of speaker amplifier 72, the output of which goes to the speaker or acoustical transducer means 74.

The receiver 16 is supplied with power from a power supply 76 which is operated thru a gravity switch 78 as previously discussed. The gravity switch 68 is preferably a mercury type gravity switch which will turn off power to the receiver whenever the receiver is in an inverted position, such as when it is being carried from loop to loop.

Figure 3:
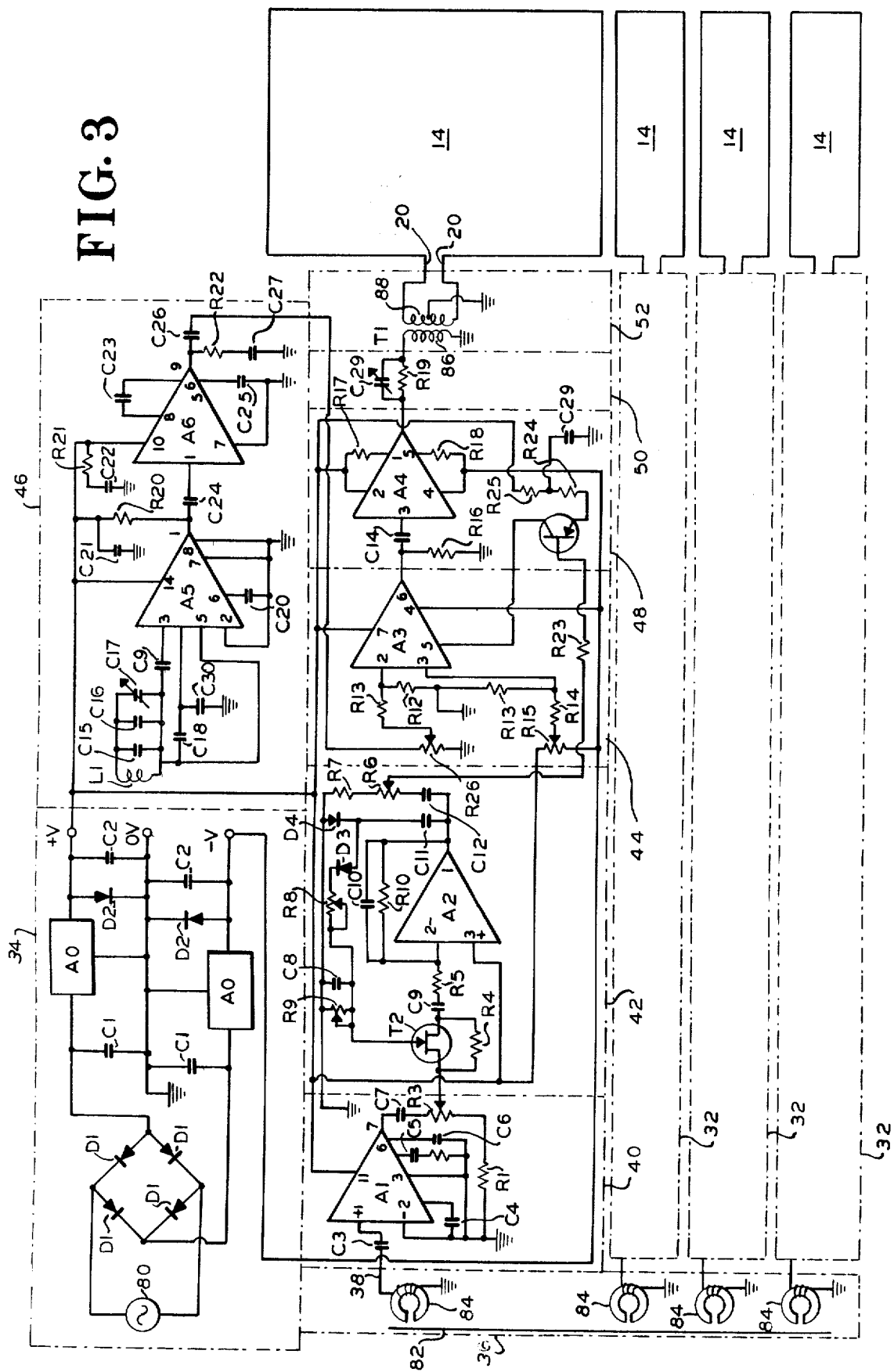
FIG. 3 is a schematic of the transmitter circuitry in which one channel means is disclosed in detail.
Figure 4:
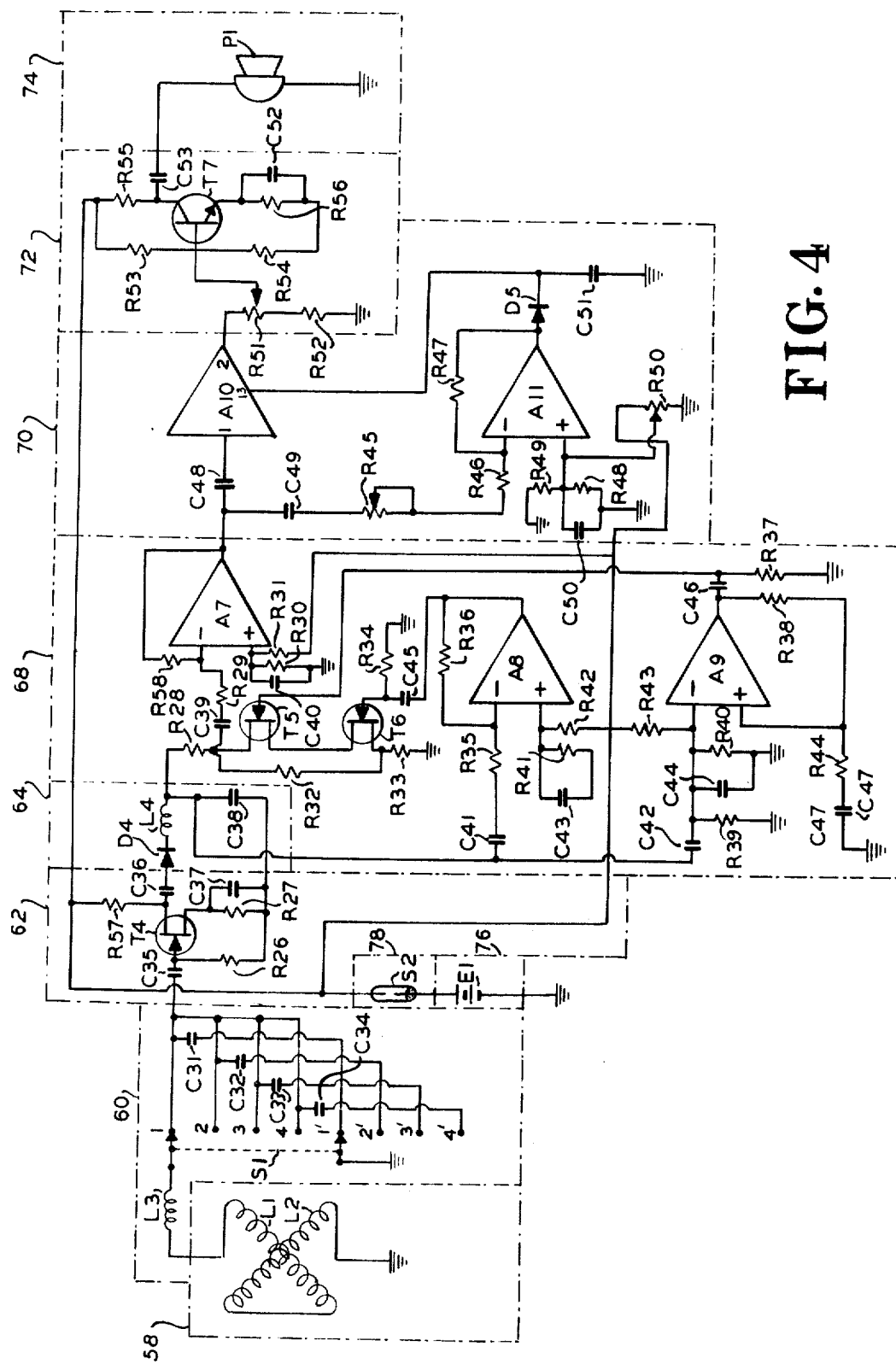
FIG. 4 is an electronic schematic of the receiver circuit.

A more detailed understanding of the invention can be had with respect to the electronic circuitry in FIG. 3 and FIG. 4.

The electronic details of the transmitting portion of the system 10 can be appreciated from a brief review of the schematic of FIG. 3.

Power for the channel means 32 is provided by power supply 34 which may be used to energize each channel means 32 individually or in parallel. Power supply 34 receives its energy from an AC source 80. The AC power is full wave rectified by a diode bridge D1. The full wave rectified power is then regulated by operational amplifiers AO both of which are tied to a common reference and smoothed by capacitors C1 and C2. Diodes D2 are optional. Power supply 34 provides at its output a pair of voltages (+) V and (−) V with respect to ground. These voltages are applied to the other elements of the channel means 32 in a manner to be described. In practice it has been found that some commercially available power supplies can satisfactorily replace supply 34.

The signal information into the channel means 32 comes from tape deck 36. Tape deck 36 is shown in FIG. 3 to include a tape element 82 and a plurality of playback heads 84. The illustration of playback heads 84 is for graphic purposes only for it will be appreciated by those of ordinary skill in the art that a considerable amount of amplification takes place in the tape deck 36, which is not schematically shown in FIG. 3. The output of tape deck 36 is fed via line 38 to the input of preamplifier 40. In a typical application, the input to each of the channel means 32 is information relating to a single display but described in a variety of languages. The signal to preamplifier 40 is passed through an AC coupling capacitor C3 to the input of operational amplifier A1. An amplified signal from the output of amplifier A1 passes through another AC coupling capacitor C7 to potentiometer R3. Potentiometer R3 may be adjusted to vary the output gain of the preamplifier 40.

The output of preamplifier 40 passes to the input of compressor 42. A gain controlling FET passes that input signal between its source and drain to an AC coupling capacitor C9 and input resistor R5, and from there to the inverting input of amplifier A2. The output of amplifier A2 is fed via coupling capacitor C12 to potentiometer R6 and on to the modulator stage 44. The output of amplifier A2 is also fed back to the gate of gain controlling transistor T2 in such a fashion as to increase the gain of the compressor for lower amplitude signals and to decrease the gain of the compressor for higher amplitude signals. In this manner, the signal information is compressed into a much more narrow dynamic range than the input signal. The feedback path of the compressor is split in two. The first path includes capacitor C11, diode D3, and potentiometer R8; the second path comprises capacitor C12, potentiometer R6, resistor R7, capacitor C8, and variable potentiometer R9. Variable potentiometers R8 and R9 serve to control the rise and release characteristics of the compressor. It will be appreciated from the circuitry that because A2 is an inverting amplifier the feedback signal to the FET will vary in inverse proportion to the amplitude of the input signal thereto. Therefore, a higher resistance will be presented to higher gain signals by T2 than to lower gain signals; therefore, lower gain signals will be amplified at a greater gain than higher gain signals. In this fashion the information from tape deck 36 has a compressed dynamic range which may be from 0 db to 20 db typically.

The output from the compressor 42 is fed to the control input of modulator amplifier A3. The balance of modulator 44 may be controlled by the appropriate setting of potentiometer R15 which forms another input to amplifier A3. A third input to amplifier A3 comes from the oscillator 46. Oscillator 46 is a free running oscillator whose frequency may be adjusted by changing the value of variable capacitors C17 or the capacitors C15 and C16 in parallel therewith.

The output from oscillator amplifier A5 is AC coupled through coupling capacitors C24 to another amplifier A6, the output of which is coupled through capacitor C26 to input potentiometer R 26. In operation the input signal to modulator 44 is used to modulate the carrier frequency generated by free running oscillator 46. The modulated carrier frequency is then passed from the output of amplifier A3 to another coupling capacitor C14 to the input of line driving amplifier A4. The line driving amplifier A4 is a conventional type of amplifier which adds gain to the input signal. The output from line driver 48 passes to an impedance matching means comprising variable capacitor C29 in parallel with resistor R19. The impedance matching means 50 is in turn connected to the primary 86 of isolation transformer T1. The primary 86 is in turn coupled to the secondary 88 where the output signal is then passed thru transmission lines 20 to closed loop antenna 14.

The impedance matching means 50 is tuned to match the output impedance of the channel means 32 to the input impedance of the antenna 14 at the carrier frequency generated by free running oscillator 46. Alternatively, if the secondaries 82 are connected in parallel as shown in FIG. 1, then the impedance matching mechanism 50 is tuned to the lowest frequency to be used in antenna 14.

The signals transmitted by the system shown in FIG. 3 are received by the receiver shown in FIG. 4. The broadcast signals are received by antenna means 58 which comprises a pair of crossed ferrite core antennas L1–L2. It has been found that by crossing the ferrite core antennas the receiver can be made to be omnidirectional. This is a general improvement over prior art types of systems in which only one ferrite core antenna is employed and that antenna must be correctly aligned with the transmitting antenna in order to receive a satisfactory signal. According to the present invention the crossed antennas L1–L2 provide greater uniformity of input signal strength than do other prior art antennas.

The output of antenna means 58 is connected to the input of frequency select device 60. The input of frequency select device 60 includes an inductance L3, a switch S1 and a plurality of capacitors C31, C32, C33, and C34. By appropriately manipulating switch S1 it is possible to put inductance L3 in series with any one of capacitors C31–C34. In this fashion, frequency select circuit 60 is a tank circuit in which the inductance L3 is constant but in which the capacitor element may be discretely selected. By choosing the appropriate capacitor the resonant frequency of L3 in combination with L2 and the capacitor will equal the frequency of the carrier generated by the transmitting means. In this manner the appropriate carrier frequency will be allowed to pass into the RF amplifier section 62.

The receiver C9 is supplied with energy from a battery E1 shown as element 76. The battery is connected in series with a mercury type gravity switch S2 shown as element 78. As previously described power from battery E1 is supplied to the active elements of the receiver whenever the receiver is held in an upright position. Under those circumstances the mercury in the switch S2 makes contact across to adjacent elements inside the switch. However, when the receiver is held in the inverted position, such as when a visitor may be carrying it by its strap, the mercury within the switch S2 does not cause a short between the two internal contacts and therefore power from battery E1 is not supplied to the rest of the circuit and the circuit is therefore inactive.

The output from frequency select circuit 60 passes thru coupling capacitor C35 to the input of an RF amplifier 62. The input signal thereto is amplified by FET-T4 which is used in a manner well known in the art to amplify RF signals. The output of RF amplifier 62 passes thru coupling capacitor C36 into diode detector 64. Diode D4 therein detects the positive portion of the incoming signal and passes the signal thru inductor L4 and resistor R28 to the input of expander circuit 68.

Resistor R28 forms a voltage divider with the series connected transistors T5 and T6 and parallel resistance R32 and series resistor R33. Transistors T5 and T6 are N channel FET's of the sort well known in the art. The output from the voltage divider passes via coupling capacitor C39 and resistor R29 to the input of amplifier A7. Expander circuit 68 is an improvement over prior art expander circuits and includes a pair of feed forward paths that respectively control the resistances of T5 and T6. One feed forward path includes capacitor C41, resistor R35, amplifier A8, capcitor C45, and N channel FET T6. The other feed forward path includes capacitor C42, amplifier A9, capacitor C46, and N channel FET T5. According to this embodiment amplifier A8 produces a positive output whenever the input is negative. Conversely, amplifier A9 produces a positive output whenever its input is positive. Therefore, on the positive half cycle the output of amplifier A9 will be positive and the N channel FET T5 will tend to turn on and drop in resistance, but at the same time the output from amplifier A5 will be negative thereby tending to turn off FET T6. Accordingly, the greater the value of the positive signal to the input of the feed forward circuit the greater the resistance of the series combination T5 and T6. With respect to the negative half cycle, T6 will tend to turn on and T5 will tend to turn off. The greater the negative signal input to the feed forward path, the higher the resistance of the series circuit T5 and T6.

It can be clearly seen then that the greater the absolute positive or negative value of the input signal to the feed forward circuit the greater the resistance of the series FET's T5 and T6. Since T5 and T6 form a voltage divider with resistor R 28, the input signal passed to amplifier A7 will be greater when the series circuit T5 and T6 has its highest resistance. In this manner higher level signals will get a proportionately greater amplification than lower level signals. It is clear therefore that circuit 68 acts as an expander which because higher volume signals are amplified at a greater gain than lower volume signals, the dynamic range of the output will be greatly increased.

As previously discussed the non-linear characteristics of compressor 42 and expander 68 are inversely matched with each other. Therefore, the non-linear distortion deliberately impressed upon the signals in the compressor 42 is corrected for by the non-linear characteristics of the expander 68 and the output therefrom is a virtually true reproduction of the electronic information received from the tape deck 36.

Squelch circuit 70 includes a feed forward capacitor C49, variable resistor R45, input resistor R46, amplifier A11, and diode D5. The cathode of diode D5 is connected to the gain control terminal of amplifier A13. The input to amplifier A10 is coupled from amplifier A7 via coupling capacitor C48. Amplifier A-11 acts as a threshold detector in which the threshold voltage can be selectively adjusted by means of variable resistor R50. Whenever the input voltage to amplifier A-11 exceeds the threshold voltage, then the input to the gain control terminal of amplifier A10 allows the amplifier to operate. However, when the signal to amplifier A-11 is below the threshold set by resistor R50, then the gain control input to amplifier A10 causes the amplifier to shut off. According to the illustrated embodiment the amplifier A-11 is designed to detect signals above a positive threshold, but it would be clear to those of ordinary skill in the art that the same procedure could be used for negative signals too. The positive output from amplifier A-11 is passed via diode D5 to the input of the gain control terminal of amplifier A10.

A smoothing capacitor C51 serves to make the squelch circuit less responsive to minor variations in the input signal.

The output of squelch circuit 70 is fed via gain control resistor R51 to the base of transistor T7 of conventional output amplifier 72. The amplified output from T7 is fed to acoustical transducer P1 thru capacitor C53. In practice, P1 is a speaker having an effective limited range of only a few feet or less. In some applications, an earphone or similar transducer having a more limited range may be desirable.

The following is a partial parts list of the semiconductor elements employable in the system just described:

| Element | Commercial Product |
|---|---|
| Element A0 | National Semiconductor LM340K-15 or/and LM320K-15 |
| Element A1 | National Semiconductor LM382 |
| Element A2 | National Semiconductor Quad Operational Amplifier LM324 |
| Element A3 | RCA 3080A |
| Element A4 | National Semiconductor LH0002CHN |
| Element A5 | National Semiconductor LM375N |
| Element A6 | National Semiconductor LH0002CHN |
| Elements A7, A8, A9, A11 | National Semiconductor LM324 Quad Operational Amplifier |
| Element A10 | National Semiconductor MM5616A Quad Analog Gate |

It will be appreciated from the foregoing disclosure and partial parts list that the semiconductor elements used in the manufacture of this system are conventional electronic components.

In a general manner, while there has been disclosed the defective and efficient embodiments of the invention, it should be well understood that the invention is not limited to such embodiments as there might be changes in the arrangement, disposition, and form of the parts without departing from the principle of the present invention as comprehended within the scope of the accompanying claims.

I claim:

1. An improved, low power, multi-channel tour guide system comprising:
 a transmitter including:
  a multi-channel recording means, a plurality of channel means connected to said recording means and a closed loop transmitting antenna coupled to said channel means, and
 at lease one portable receiver including:
  a receiving antenna,
  a detector connected to said receiving antenna,
  an expander having an input and an output terminal, said input terminal being connected to said detector, said expander including an expander amplifier and a feed forward circuit connected to the input terminal of said expander amplifier, said feed forward circuit comprising:
   a first and second branch, each of said branches being in electronic parallel with the other and wherein
    said first branch includes an amplifier means therein and said second branch includes an inverting type amplifier therein,
   a variable resistance means connected to both of said branches, and an input resistor between said expander amplifier input terminal and said variable resistance means and forming a variable resistance voltage divider network therewith, wherein low amplitude level signals are substantially shunted to ground by the variable resistance means and high amplitude level signals are passed to said expander amplifier whereby higher amplitude level signals are amplified with more gain than lower amplitude signals, said receiver further including an acoustical transducer means connected to the output of said expander means.

2. An improved, low power, multi-channel tour guide system comprising:

a transmitter including:

a recording means, at least one channel means and a closed loop transmitting antenna, each channel means comprising:

an electronic compressor connected to said recording means, an oscillator means, a modulator means connected to said oscillator means and to said compressor, and a coupling means for connecting said channel means to said closed loop transmitting antenna, and at least one portable receiver including, a receiving antenna, a detector connected to said receiving antenna, an expander having an input and an output terminal, said input terminal being connected to said detector, and an acoustical transducer means connected to the output of said expander means, said expander means further comprising:

an expander amplifier, and a feed forward circuit connected to the input terminal of said expander amplifier, said feed forward circuit comprising:

a first and second branch, each of said branches being in electronic parallel with the other and wherein said first branch includes an amplifier means therein and said second branch includes an inverting type amplifier therein, a variable resistance means connected to both of said branches, said variable resistance means comprising a first and second field effect transistor with gates coupled together and with their cources and drains connected in series, said series combination of both having an expansion limiting resistance in shunt therewith, and wherein the gate of said first field effect transistor is connected to the output of said first branch and the gate of said second field effect transistor is connected to the output of said second branch, and an input resistor between said expander amplifier input terminal and said variable resistance means and forming a variable resistance voltage divider network therewith, wherein low amplitude level signals are substantially shunted to ground by said variable resistance means and high amplitude level signals are passed to said expander amplifier whereby higher amplitude level signals are amplified with more gain than lower amplitude signals.

3. The invention of claim 2 wherein said receiver includes:

a power source operatively connected to said receiver for providing electrical energy thereto, and a squelch means for recuding the drain on said power source whenever the input signal to said receiver is below a certain threshold value.

4. The invention of claim 3 wherein said receiver further includes, a radio frequency amplifier connected between said frequency select means and said detector, and an output driver means connected between said expander and said squelch means.

5. The invention of claim 4 wherein said detector is a diode detector.

6. The invention of claim 5 wherein the receiving antenna comprises a pair of ferrite core antennas aligned in a crossed configuration relative to one another, said configuration thereby making said receiving antenna substantially omni-directional.

7. The invention of claim 6 wherein said power source has connected therewith a gravity operated type switch which cuts off power to the receiver when said receiver chasis is inverted.

8. The invention of claim 7 wherein the transmitting antenna comprises one closed loop and each of the isolation transformer secondaries are connected in parallel across said loop.

9. The invention of claim 7 wherein said transmitting antenna comprises a plurality of loop antennas each connected to the secondary of one of said isolation transformers respectively.

10. The invention of claim 2 wherein said oscillator means is a master oscillator which feeds each modulator simultaneously, said master oscillator being a free running oscillator.

* * * * *